United States Patent
Oosaka et al.

(10) Patent No.: US 12,105,117 B2
(45) Date of Patent: Oct. 1, 2024

(54) ELECTRICAL COMPONENT INSPECTION INSTRUMENT

(71) Applicant: JAPAN AVIATION ELECTRONICS INDUSTRY, LIMITED, Tokyo (JP)

(72) Inventors: Junji Oosaka, Tokyo (JP); Osamu Hashiguchi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 17/369,165

(22) Filed: Jul. 7, 2021

(65) Prior Publication Data

US 2022/0107342 A1     Apr. 7, 2022

(30) Foreign Application Priority Data

Oct. 6, 2020   (JP) .................................. 2020-169210

(51) Int. Cl.
*G01R 1/067*   (2006.01)
*G01R 1/073*   (2006.01)

(52) U.S. Cl.
CPC ..... *G01R 1/06722* (2013.01); *G01R 1/07307* (2013.01)

(58) Field of Classification Search
CPC .......................... G01R 1/06722; G01R 1/07307
See application file for complete search history.

(56) References Cited

U.S. PATENT DOCUMENTS

| | | | | |
|---|---|---|---|---|
| 6,856,131 B2 * | 2/2005 | Miyazawa | ......... | G01R 29/0878 324/252 |
| 7,116,121 B1 * | 10/2006 | Holcombe | ......... | G01R 1/06722 324/755.05 |
| 7,161,366 B2 * | 1/2007 | Herrick | .............. | G01R 31/2831 324/756.03 |
| 8,882,524 B2 * | 11/2014 | Golko | .................... | H01R 29/00 439/218 |
| 10,535,938 B2 * | 1/2020 | Sherman | ................ | H01R 13/50 |
| 11,209,460 B2 | 12/2021 | Ito | | |

(Continued)

FOREIGN PATENT DOCUMENTS

EP          1341254 A2 *  9/2003   .............. H01P 1/047
JP       H05-251524         9/1993

(Continued)

OTHER PUBLICATIONS

EP 2 942 837 A1 by Weigand Josef (Year: 2014).*

(Continued)

*Primary Examiner* — Paresh Patel
(74) *Attorney, Agent, or Firm* — GREENBLUM & BERNSTEIN, P.L.C.

(57) ABSTRACT

An electrical component inspection instrument includes a substrate and a rod-shaped conductor component having one end for contact with a conductor of an electrical component which is an object to be inspected. A conductor pattern on a board surface of the substrate reaches an edge of the substrate, and the other end of the rod-shaped conductor component is electrically connected to the conductor pattern at the edge of the substrate. A direction in which the rod-shaped conductor component extends is orthogonal to the direction of the normal to the board surface of the substrate.

2 Claims, 10 Drawing Sheets

(56) References Cited

U.S. PATENT DOCUMENTS

| | | | | |
|---|---|---|---|---|
| 2004/0095157 A1* | 5/2004 | Sato | ............... | G01R 1/07371 |
| | | | | 324/756.01 |
| 2006/0103400 A1* | 5/2006 | Herrick | ............ | G01R 31/2831 |
| | | | | 324/756.03 |
| 2009/0009205 A1* | 1/2009 | Kazama | ............ | G01R 1/06722 |
| | | | | 324/755.05 |
| 2010/0244872 A1* | 9/2010 | Yoshida | ............ | G01R 1/07371 |
| | | | | 324/754.03 |
| 2015/0171561 A1* | 6/2015 | Little | ............... | H01R 13/6658 |
| | | | | 439/607.34 |

FOREIGN PATENT DOCUMENTS

| | | |
|---|---|---|
| JP | 2004-170182 | 6/2004 |
| JP | 2018-179758 | 11/2018 |

OTHER PUBLICATIONS

Office Action issued in Corresponding Korean Patent Application No. 10-2021-0089606, dated Apr. 17, 2023, along with an English translation thereof.

Office Action issued in Corresponding Japanese Patent Application No. 2020-169210, dated Jan. 23, 2024, along with an English translation thereof.

* cited by examiner

ELECTRICAL COMPONENT INSPECTION INSTRUMENT

TECHNICAL FIELD

The present disclosure relates to an electrical component inspection instrument including a rod-shaped conductor component as a contact component that makes contact with an electrical component which is an object to be inspected.

BACKGROUND ART

An electrical component inspection instrument that is used for an inspection of an electrical component and includes a rod-shaped conductor component as a contact component which makes contact with the electrical component is known. Here, the "electrical component" is a component that is used in an electric circuit irrespective of the type of signal, and examples of the electrical component include an integrated circuit, a printed board, and a connector. Examples of the "inspection" include an inspection for a defect or electrical characteristics of the electrical component.

Examples of prior art of this electrical component inspection instrument include Japanese Patent Application Laid Open No. 2004-170182 (hereinafter referred to as "Patent Literature 1"). FIG. 1 attached to the description of the present application is a copy of FIG. 4 of Patent Literature 1. In the configuration of an electrical component inspection instrument which is disclosed in FIG. 1, a cable 37 is attached to a lower board surface of a substrate 36 and a metal block 31 housing rod-shaped conductor components 33, 34, and 35 (in Patent Literature 1, the rod-shaped conductor component is a contact probe) is attached to an upper board surface of the substrate 36.

As is understood from the description of paragraph 0005 of Patent Literature 1, an electrical component inspection instrument usually includes the required number of rod-shaped conductor components and, in accordance with this configuration, the required number of cables are attached to a substrate that is housed inside the electrical component inspection instrument. That is, the substrate has to have a size that allows the required number of cables or the required number of cables and the required number of rod-shaped conductor components to be attached to one side of the substrate, which inhibits miniaturization of the electrical component inspection instrument.

BRIEF SUMMARY OF THE INVENTION

In view of this background art, an electrical component inspection instrument having an internal structure contributing to miniaturization is provided.

The following technical matters are described simply to facilitate the understanding of the main points of the present invention, not to limit the invention claimed in the claims explicitly or implicitly and not to express the possibility of accepting such a limitation that is imposed by a person other than those who will benefit from the present invention (for example, the applicant and the right holder). The general outline of the present invention described from other perspectives can be understood from, for example, the claims of this application as originally filed at the time of application.

An electrical component inspection instrument has an internal structure in which a rod-shaped conductor component is attached to an edge of a substrate.

A direction in which the rod-shaped conductor component extends is perpendicular to the direction of the normal to a board surface of the substrate.

These and other objects, features and advantages of the present invention will become apparent from the detailed description taken in conjunction with the accompanying drawings.

EFFECTS OF THE INVENTION

According to the present invention, since a location, where a rod-shaped conductor component is attached, on a board surface of a substrate is not necessary, miniaturization of an electrical component inspection instrument is achieved. Furthermore, for example, since it is possible to attach half the required number of cables to one board surface of the substrate and attach remaining half the number of cables to the other board surface of the substrate, miniaturization of the electrical component inspection instrument is achieved.

BRIEF DESCRIPTION OF THE DRAWINGS

The subject matter, which is regarded as the invention, is particularly pointed out and distinctly claimed in the claims at the conclusion of the specification. The present invention itself, and manner in which it may be made or used, if any, may be better understood after a review of the following description in connection with the accompanying drawings in which:

LIST OF REFERENCE NUMERALS

Figure 1:
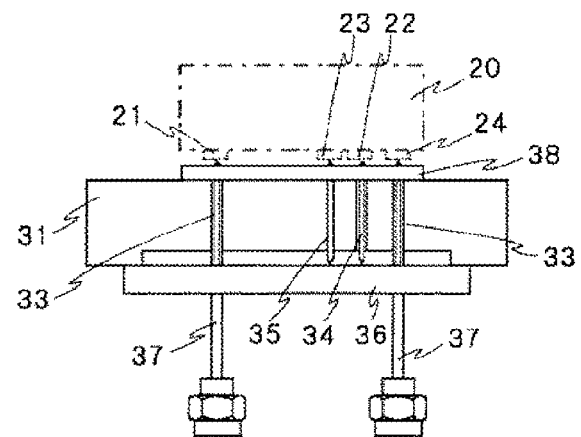
FIG. 1 shows FIG. 4 of Patent Literature 1.

With regard to reference numerals used, the following numbering is used throughout the drawings.

1: cover
1a: plate portion
1b: side wall portion
1c: through hole
1d: hook
1e: board surface
1f: board surface
3: frame body
3a: plate portion
3b: through hole
3c: groove portion
3d: inner wall surface 3e: hook
3f: board surface
3g: board surface
5: tubular body
5a: large rectangular parallelepiped
5b: small rectangular parallelepiped
5c: large hole
5d: small hole
5e: through hole
5f: block
5g: step portion
5h: one end
5i: supporting rod
5k: the other end
5m: end surface
5n: end surface
10: substrate
10a: board surface
10b: board surface
10c: conductor portion
10d: conductor portion
10e: conductor portion
10f: conductor portion
10g: conductor portion
10h: edge
10i: recess
10k: conductor pattern
30: rod-shaped conductor component
30a: one end
30b: the other end
30c: barrel
50: metal component
50a: head portion
50b: neck portion
50c: shoulder portion
50d: arm portion
50e: arm portion
50f: recess
70: cable
70a: L-shaped connector
90: compression coil spring
100: electrical component inspection instrument
900: board-to-board connector
901: contact
903: metal frame body

DETAILED DESCRIPTION

Figure 2:
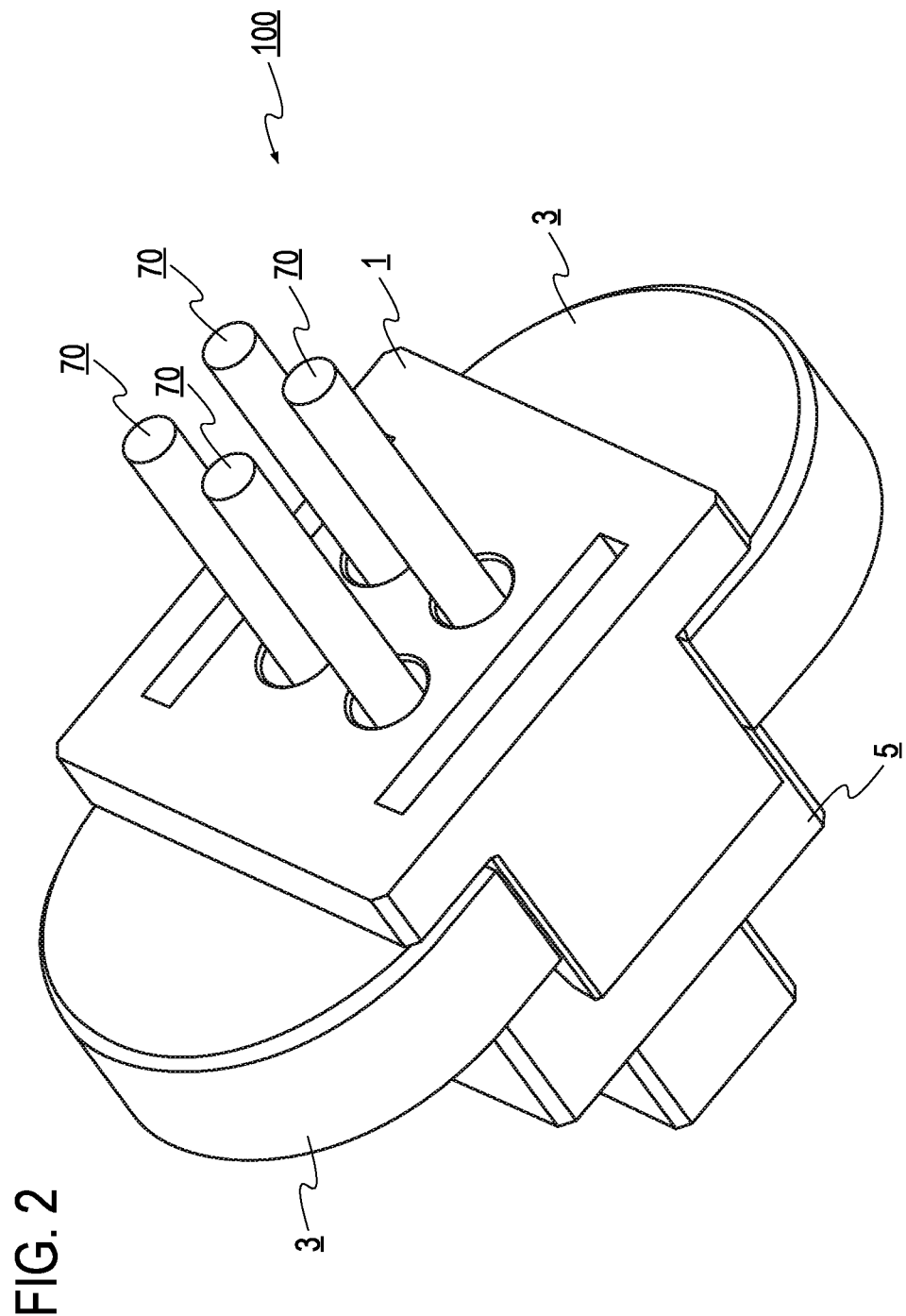
FIG. 2 is a perspective view of an electrical component inspection instrument viewed obliquely from above.
Figure 3:
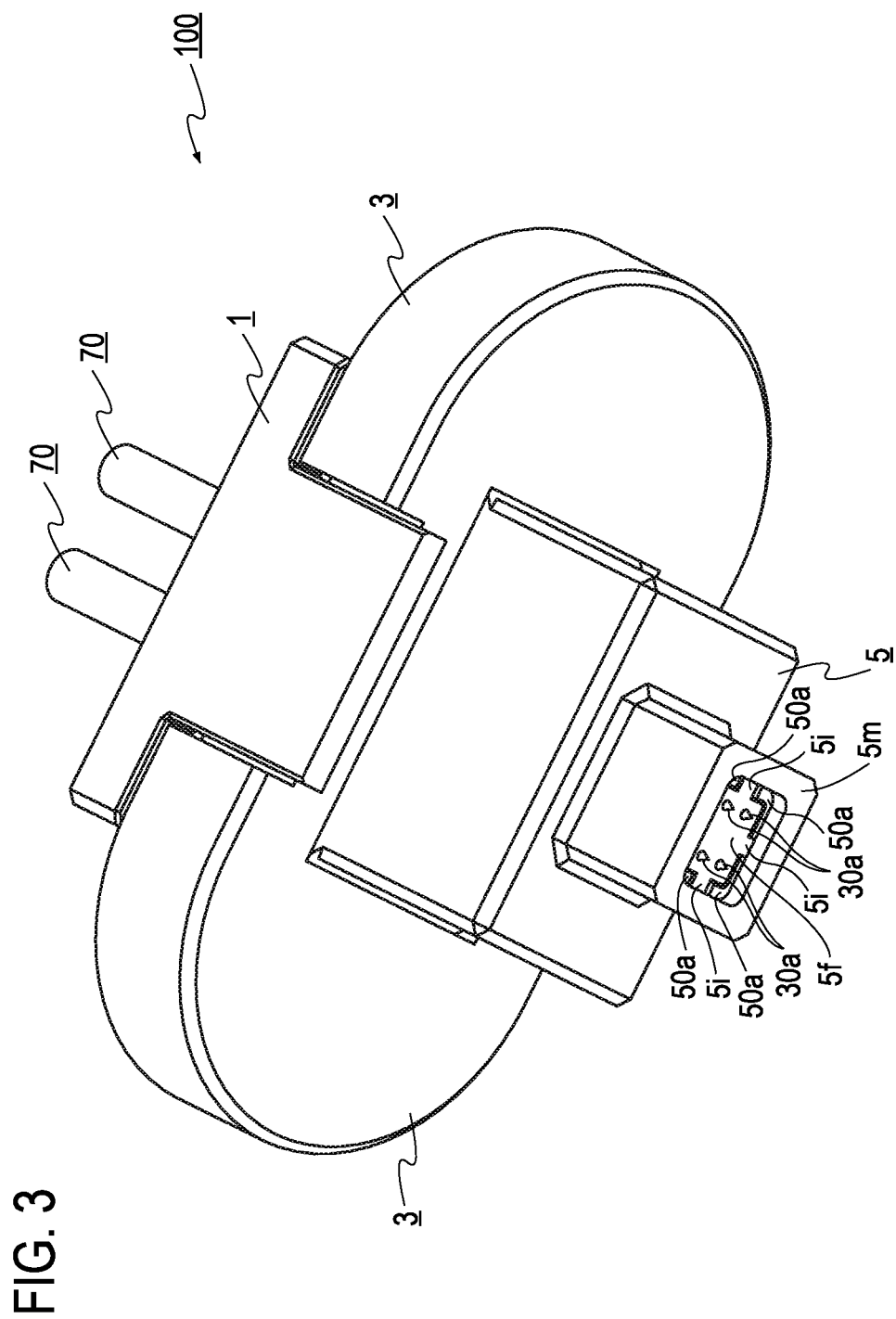
FIG. 3 is a perspective view of the electrical component inspection instrument viewed obliquely from below.
Figure 4:
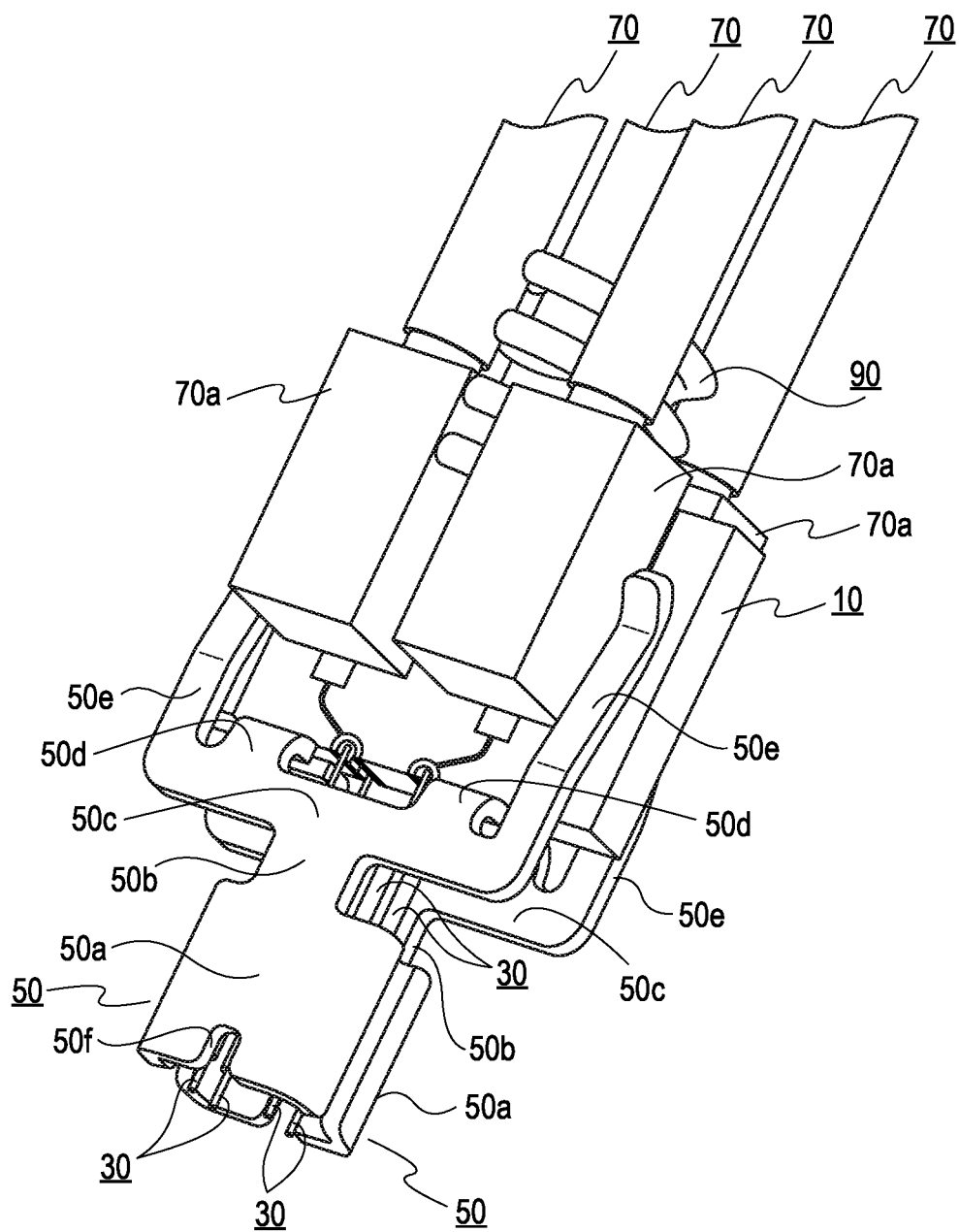
FIG. 4 shows the internal structure of the electrical component inspection instrument.
Figure 5:
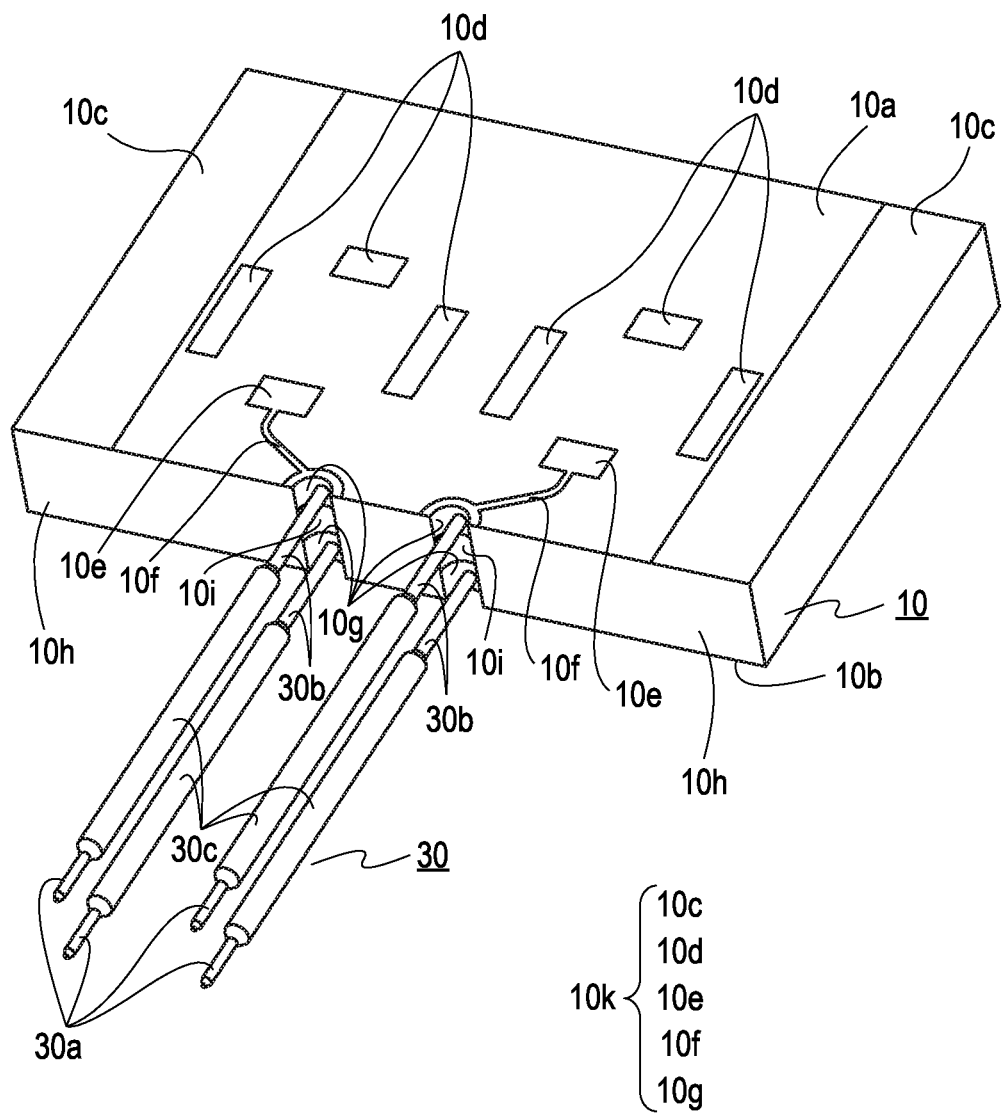
FIG. 5 shows the placement of a substrate and rod-shaped conductor components.
Figure 6:
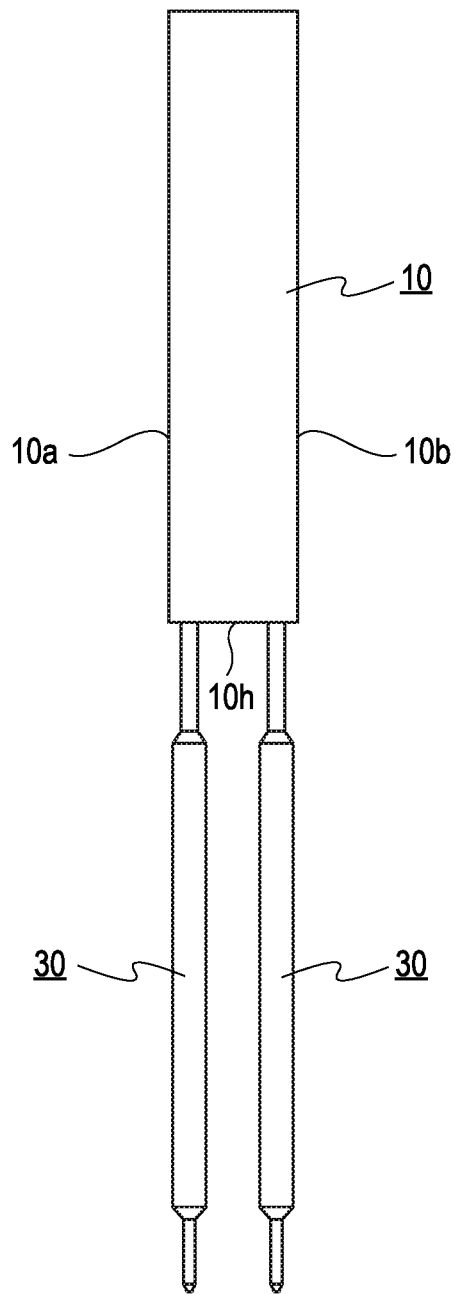
FIG. 6 shows the placement of the substrate and the rod-shaped conductor components.
Figure 7:
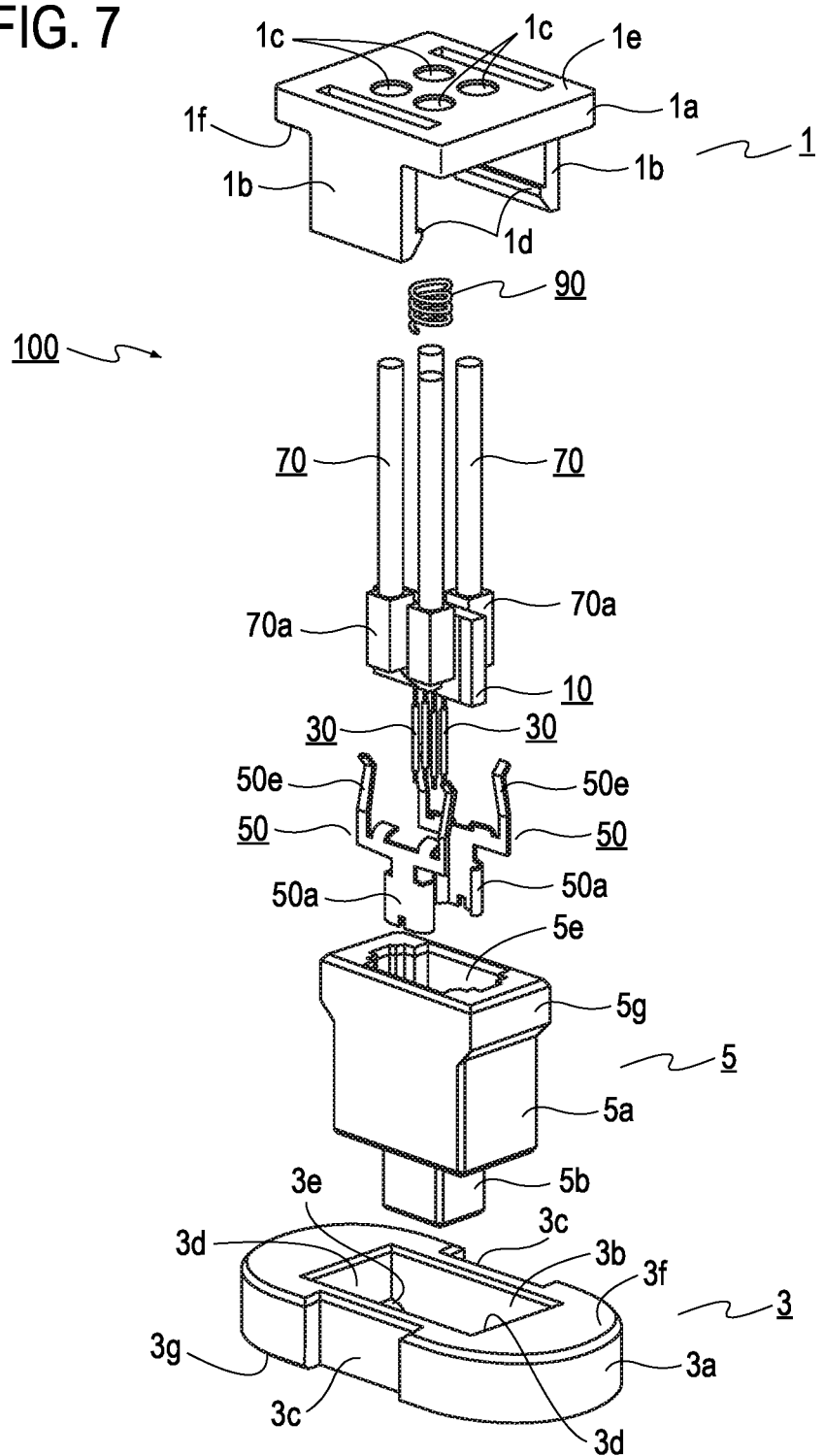
FIG. 7 is an exploded perspective view of the electrical component inspection instrument.
Figure 8:
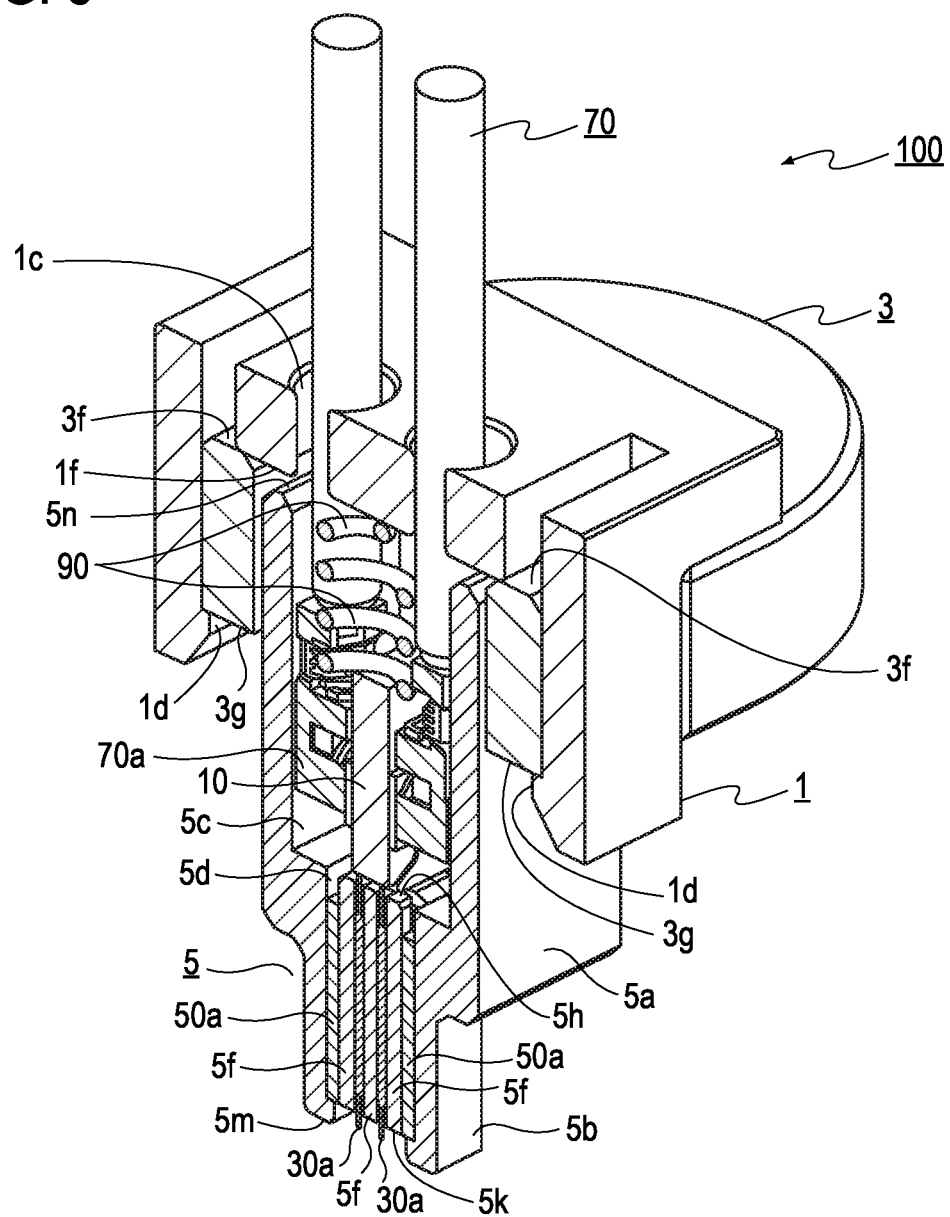
FIG. 8 is a sectional view of the electrical component inspection instrument.
Figure 9:
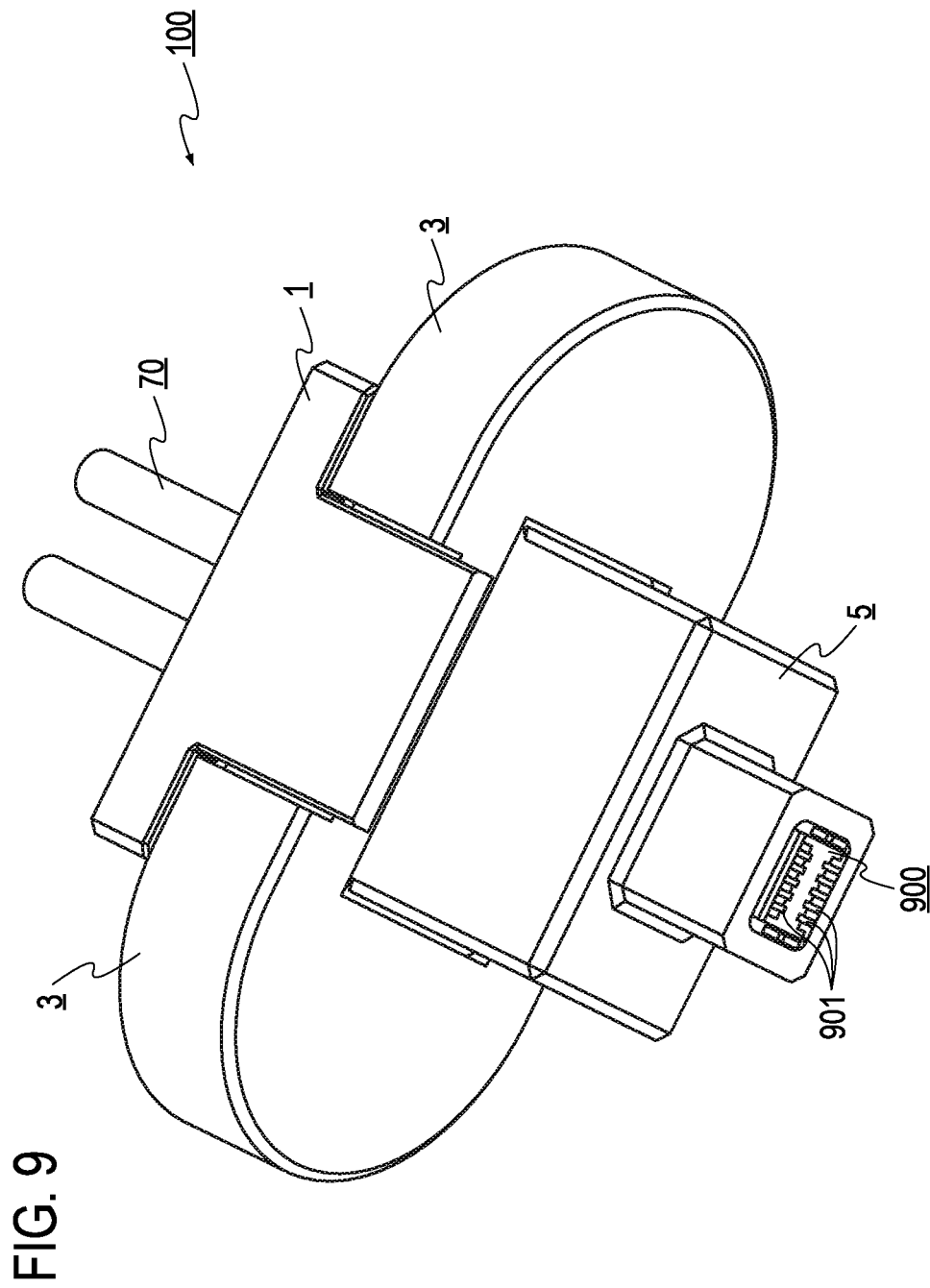
FIG. 9 shows the electrical component inspection instrument to which an electrical component is attached.
Figure 10:
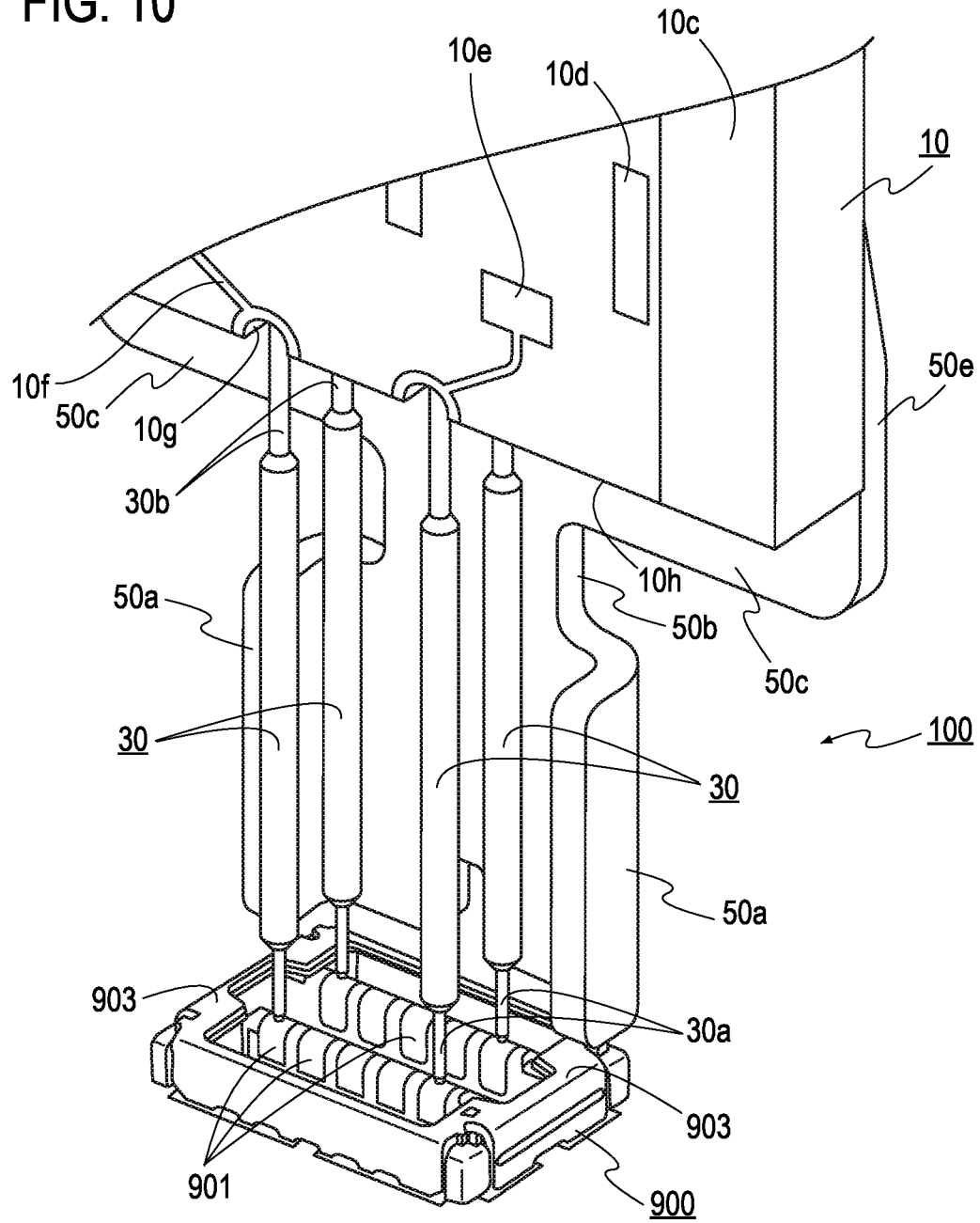
FIG. 10 is an exploded view of the electrical component inspection instrument to which the electrical component is attached.

The structure of an electrical component inspection instrument 100 of an embodiment will be described with reference to FIGS. 2 to 10. In this embodiment, an electrical component which is inspected using the electrical component inspection instrument 100 is, for example, a board-to-board connector 900 that is used in a high frequency range above several hundred MHz.

The electrical component inspection instrument 100 includes a cover 1 made of resin, a frame body 3 made of resin, a tubular body 5 made of resin, a substrate 10, four rod-shaped conductor components 30, two metal components 50, four cables 70, and a compression coil spring 90.

The cover 1 includes one rectangular plate portion 1a and two rectangular side wall portions 1b. The two side wall portions 1b extend in the same direction from two sides of the plate portion 1a which are located in the width direction of the plate portion 1a. The plate portion 1a has four cylindrical through holes 1c in the central part thereof. Each through hole 1c has an opening in one board surface 1e of the plate portion 1a and an opening in the other board surface 1f of the plate portion 1a. An end portion of each side wall portion 1b has a hook 1d protruding toward the inside of the cover 1.

The frame body 3 has a frame-like shape in which one through hole 3b in the shape of a rectangular parallelepiped is formed in the central part of an oval plate portion 3a. The frame body 3 has a groove portion 3c in each of two outer side surfaces of the frame body 3 which are located in the width direction of the frame body 3. The groove portion 3c reaches, from one board surface 3f of the plate portion 3a of the frame body 3, the other board surface 3g of the plate portion 3a of the frame body 3. Each of two inner wall surfaces 3d, which are located in the length direction of the frame body 3, of four inner wall surfaces of the frame body 3 which surround the through hole 3b has a hook 3e protruding toward the center of the through hole 3b. The hook 3e is located near the boundary between the inner wall surface 3d and the other board surface 3g of the plate portion 3a of the frame body 3.

The tubular body 5, which is a one-piece component, has an outer shape configured with two rectangular parallelepipeds 5a and 5b which have different sizes and are joined together. A large hole 5c formed in the large rectangular parallelepiped 5a and a small hole 5d formed in the small rectangular parallelepiped 5b communicate with each other inside the tubular body 5, and the large hole 5c and the small hole 5d form a through hole 5e of the tubular body 5. A block 5f, which is in the shape of a rectangular parallelepiped and is supported by four supporting rods 5i extending from inner wall surfaces of the small rectangular parallelepiped 5b which surround the small hole 5d, is located inside the small hole 5d. One end 5h of the block 5f in a direction in which the through hole 5e extends is located near the boundary between the large hole 5c and the small hole 5d. The other end 5k of the block 5f in the direction in which the through hole 5e extends is located in a location slightly recessed from an end surface 5m around an opening of the small hole 5d. The block 5f has, in the central part thereof, four cylindrical through holes extending in the direction in which the through hole 5e extends. The large rectangular parallelepiped 5a has a step portion 5g protruding to the outside of the rectangular parallelepiped 5a from two short sides of the rectangular parallelepiped 5a around an opening of the large hole 5c.

The substrate 10 is, for example, a rigid-type printed board obtained by hardening glass fiber using epoxy resin. A conductor pattern 10k reaching an edge 10h, which is one of four edges of the substrate 10, is formed on each of one board surface 10a and the other board surface 10b of the substrate 10 in the shape of a thin flat plate. In this embodiment, the conductor pattern 10k has conductor portions 10c, 10d, 10e, 10f, and 10g. Also on the other board surface 10b, which cannot be seen in FIG. 5, of the substrate 10, conductor portions 10c, 10d, 10e, and 10f whose shapes and placement are the same as the shapes and placement of the conductor portions 10c, 10d, 10e, and 10f on the one board surface 10a, which can be seen in FIG. 5, of the substrate 10 are formed. The conductor portions 10c and 10d are ground lines. Part of the edge 10h of the substrate 10 is recessed toward the center of the substrate 10; in this example, the edge 10h of the substrate 10 has two recesses 10i in the shape of a semicylinder. Each recess 10i reaches the other board surface 10b of the substrate 10 from the one board surface 10a of the substrate 10. The recess 10i has the conductor portion 10g near the boundary between the one board surface 10a of the substrate 10 and the recess 10i. The conductor portion 10g close to the one board surface 10a and the conductor portion 10e located on the one board surface 10a are electrically connected by the conductor portion 10f which is long and thin and located on the one board surface 10a. Likewise, the recess 10i has the conductor portion 10g near the boundary between the other board surface 10b of the substrate 10 and the recess 10i. The conductor portion 10g close to the other board surface 10b and the conductor portion 10e located on the other board surface 10b are electrically connected by the conductor portion 10f which is long and thin and located on the other board surface 10b. The spacing between the two recesses 10i is determined by the spacing between conductors of the electrical component which is an object to be inspected.

Each metal component 50, which is a one-piece component, includes a head portion 50a, a neck portion 50b, a shoulder portion 50c, two short arm portions 50d, and two long arm portions 50e. The head portion 50a is a rectangular plate portion, and the neck portion 50b, which is a rectangular flat plate portion smaller than the head portion 50a, is connected to one side of the head portion 50a. The edges of two opposite sides, to which the neck portion 50b is not connected, of the head portion 50a are slightly bent in the same direction. At the edge of one side of the head portion 50a which faces the one side of the head portion 50a to which the neck portion 50b is connected, the head portion 50a has a recess 50f recessed toward the central part of the head portion 50a. The central part of a long side of the shoulder portion 50c, which is a long and thin flat plate portion, is connected to a long side of the neck portion 50b which faces a long side of the neck portion 50b to which the head portion 50a is connected. The two long arm portions 50e extend, at both ends of the shoulder portion 50c in the length direction thereof, in the same direction from a long side of the shoulder portion 50c which faces the long side of the shoulder portion 50c to which the neck portion 50b is connected. Furthermore, the two short arm portions 50d extend, on both sides of the central part of the shoulder portion 50c, in the same direction from the long side of the shoulder portion 50c which faces the long side of the shoulder portion 50c to which the neck portion 50b is connected. The long arm portions 50e are slightly bent, near the shoulder portion 50c, in the same direction as the direction in which the edges of the two sides of the head portion 50a are bent, and are slightly bent, near the tips of the long arm portions 50e, in a direction opposite to the direction in which the edges of the two sides of the head portion 50a are bent. The short arm portions 50d are bent about 90°, near the shoulder portion 50c, in the same direction as the direction in which the edges of the two sides of the head portion 50a are bent. The central part of the head portion 50a, the neck portion 50b, the shoulder portion 50c, and the base of the long arm portions 50e are located in the same plane.

Next, assembly of the electrical component inspection instrument 100 will be described.

First, the four rod-shaped conductor components 30 are housed in the four through holes of the block 5f through an opening of the through hole 5e (specifically, the opening of the large hole 5c) of the tubular body 5. In this embodiment, each rod-shaped conductor component 30 has one end 30a for contact with a conductor (in this embodiment, a contact 901 of the board-to-board connector 900) of the electrical component (in this embodiment, the board-to-board connector 900) which is the object to be inspected and the other end 30b for electrical connection with the conductor pattern 10k of the substrate 10, and the rod-shaped conductor component 30 may be a long and thin rod made of metal or an instrument (which is referred to as a pogo pin, a spring pin, a spring probe, or the like by a person skilled in the art) including a plunger and a spring structure which is coupled to the plunger. It is preferable that the one end 30a of the rod-shaped conductor component 30 is a movable plunger for reliable contact with the conductor of the electrical component. Furthermore, the other end 30b of the rod-shaped conductor component 30 may be electrically connected to the conductor pattern 10k by solder; from the viewpoint of avoiding fluctuations in impedance which may be caused by solder and reliably and electrically connecting the other end 30b of the rod-shaped conductor component 30 to the conductor pattern 10k, it is preferable that the other end 30b of the rod-shaped conductor component 30 is a movable plunger. In this embodiment, the one end 30a and the other end 30b of the rod-shaped conductor component 30 are movable plungers. A barrel 30c of the rod-shaped conductor component 30 incorporating a spring is press-fit into the through hole of the block 5f, whereby the rod-shaped conductor component 30 is fixed to the tubular body 5. The one end 30a of the rod-shaped conductor component 30 protrudes from an end surface of the other end 5k of the block 5f, and the other end 30b of the rod-shaped conductor component 30 protrudes from an end surface of the one end 5h (specifically, the end facing the large hole 5c) of the block 5f.

Next, the two metal components 50 are housed inside the tubular body 5 through the opening of the through hole 5e (specifically, the opening of the large hole 5c) of the tubular body 5. In a state in which the two metal components 50 are housed inside the tubular body 5, the positional relationship between the two metal components 50 is two-fold rotational symmetry and the tips of the short arm portions 50d bent in one of the metal components 50 and the tips of the short arm portions 50d bent in the other one of the metal components 50 face each other. The head portions 50a of the metal components 50 are press-fit into a space between the block 5f of the tubular body 5 and the inner wall surfaces of the small rectangular parallelepiped 5b, whereby the metal components 50 are fixed to the tubular body 5. Two supporting rods 5i of the four supporting rods 5i of the tubular body 5 are located in the recesses 50f of the head portions 50a of the metal components 50. Each of the remaining two supporting rods 5i is located in the interspace between the edge of the head portion 50a bent in one of the metal components 50 and the edge of the head portion 50a bent in the other one of the metal components 50. The bent short arm portions 50d of the metal components 50 are in contact with the one end 5h of the block 5f, whereby the metal components 50 are positioned inside the tubular body 5. In a state in which each metal component 50 is housed inside the tubular body 5, one side of the head portion 50a, which faces one side of the head portion 50a to which the neck portion 50b is connected, slightly protrudes into a space surrounded with the end surface of the other end 5k of the block 5f and the inner wall surfaces of the small rectangular parallelepiped 5b which surround the small hole 5d.

Next, the substrate 10 to which the four cables 70 are attached is housed inside the tubular body 5 through the opening of the through hole 5e (specifically, the opening of the large hole 5c) of the tubular body 5. In this embodiment, each cable 70 is a coaxial cable having one end to which an L-shaped connector 70a is attached. The L-shaped connector 70a is connected to the conductor pattern 10k on the substrate 10, whereby an outer conductor of the cable 70 is electrically connected to the three conductor portions 10d and a central conductor of the cable 70 is electrically connected to the conductor portion 10e. Two cables 70 are attached to the one board surface 10a of the substrate 10 and the remaining two cables 70 are attached to the other board surface 10b of the substrate 10. The four cables 70 extend in the same direction from the substrate 10 and are drawn to the outside of the tubular body 5 from the opening of the large hole 5c of the tubular body 5. Inside the tubular body 5, the substrate 10 is located in the interspace between the long arm portions 50e of one of the metal components 50 and the long arm portions 50e of the other one of the metal components 50 and the conductor portions 10c of the substrate 10 are in contact with the long arm portions 50e of the metal components 50.

Next, the compression coil spring 90 is pushed between the four cables 70, that is, into the interspace surrounded with the four cables 70 located at the vertices of a rectangle when viewed from a direction in which the cables 70 extend, through the opening of the through hole 5e (specifically, the opening of the large hole 5c) of the tubular body 5.

Next, the frame body 3 is attached to the large rectangular parallelepiped 5a of the tubular body 5. By passing the tubular body 5 through the through hole 3b of the frame body 3, the step portion 5g of the tubular body 5 gets caught on the hook 3e of the frame body 3. In a state in which the frame body 3 is attached to the tubular body 5, an end surface 5n around the opening of the large hole 5c of the tubular body 5 and the one board surface 3f of the plate portion 3a of the frame body 3 are located in the same plane.

Next, the cover 1 is attached to the frame body 3. Each side wall portion 1b of the cover 1 is located in the corresponding groove portion 3c of the frame body 3, and each hook 1d of the cover 1 is caught on the other board surface 3g of the plate portion 3a of the frame body 3. In a state in which the cover 1 is attached to the frame body 3, the other board surface 1f of the plate portion 1a of the cover 1 is in contact with the one board surface 3f of the plate portion 3a of the frame body 3. The four cables 70 pass through the four through holes 1c of the cover 1. In a state in which the cover 1 is attached to the frame body 3, the compression coil spring 90 is compressed by the other board surface 1f of the plate portion 1a of the cover 1 and the edge (specifically, the edge on the side opposite to the edge 10h) of the substrate 10, whereby the substrate 10 is pressed against the block 5f by the restoring force of the compression coil spring 90 and the other end 30b of the rod-shaped conductor component 30 reliably makes contact with the conductor portion 10g of the substrate 10.

As is clear from this embodiment, the electrical component inspection instrument 100 has an internal structure in which the rod-shaped conductor components 30 are attached to the edge 10h of the substrate 10 which is a region of the substrate 10 in the thickness direction thereof, and a direction in which each rod-shaped conductor component 30 extends is orthogonal to the direction of the normal to the board surface of the substrate 10. Thus, a location, where the rod-shaped conductor component 30 is attached, on the board surface of the substrate 10 is not necessary. Moreover, as described in this embodiment, by attaching half the required number of cables 70 to the one board surface 10a of the substrate 10 and attaching remaining half the number of cables 70 to the other board surface 10b of the substrate 10, it is possible to reduce by one-half the area of a location on the substrate 10 which is necessary for the attachment of the cables 70. Furthermore, since near the L-shaped connectors 70a of the cables 70 the cables 70 extend along the board surface of the substrate 10, the cables 70 have a sufficiently small effect on the size of the electrical component inspection instrument 100 in the direction of the normal to the board surface of the substrate 10.

Next, the use of the electrical component inspection instrument 100 will be described.

The electrical component inspection instrument 100 is attached to the board-to-board connector 900 secured to an unillustrated substrate. The board-to-board connector 900 is housed in the opening of the small hole 5d of the tubular body 5. In a state in which the board-to-board connector 900 is housed in the opening of the small hole 5d, a metal frame body 903 of the board-to-board connector 900 and the head portions 50a of the metal components 50 are in contact with each other and the one end 30a of each rod-shaped conductor component 30 is in contact with the contact 901 of the board-to-board connector 900.

Addendum

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims.

Moreover, the use of the terms "first", "second", "i-th", etc., if any, do not denote any order or importance, but rather the terms "first", "second", "i-th", etc. are used to distinguish one element from another. The term "first" does not necessarily mean "coming before all others in order". The terminology used herein is for the purpose of describing particular embodiments only and is not intended to limit the invention in any way. As used herein, the singular forms "a", "an" and "the" are intended to include the plural forms as well, unless the context clearly indicates otherwise. It will be further understood that the terms "comprise", "comprises", and/or "comprising," when used in this specification and/or the appended claims, specify the presence of stated features, steps, operations, elements, and/or components, but do not preclude the presence or addition of one or more other features, steps, operations, elements, components, and/or groups thereof. The same goes for "include", "includes", and/or "including". The term "and/or", if any, includes any and all combinations of one or more of the associated listed items. In the claims and the specification, unless otherwise noted, "connect", "join", "couple", "interlock", or synonyms therefor and all the word forms thereof, if any, do not necessarily deny the presence of one or more intermediate elements between two elements, for instance, two elements "connected" or "joined" to each other or "interlocked" with each other. Connection between elements, if required, may be physical connection, electrical connection, or a combination thereof. In the claims and the specification, unless otherwise noted, the term "arbitrary", if any, should be understood as a term having the same meaning as the universal quantifier ∀. For example, the expression "for arbitrary X" has the same meaning as "for every X" or "for each X".

Unless otherwise defined, all terms (including technical and scientific terms) used herein have the same meaning as commonly understood by those skilled in the art to which the invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual techniques or steps in an unnecessary fashion. Nevertheless, the specification and claims should be read with the understanding that such combinations are entirely within the scope of the invention and the claims.

The corresponding structures, materials, acts, and equivalents of all means or step plus function elements in the claims below, if any, are intended to include any structure, material, or act for performing the function in combination with other claimed elements as specifically claimed.

The foregoing description of the embodiments of the invention has been presented for the purpose of illustration and description. It is not intended to be exhaustive and to limit the invention to the precise form disclosed. Modifications or variations are possible in light of the above teaching. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An inspection instrument of an electrical component including N conductor parts, N being a predetermined integer more than one, the inspection instrument comprising:
    a printed wiring board having an edge and two board surfaces parallel and opposite to each other, one of the two board surfaces being a first board surface with a first conductor pattern printed on the first board surface, the other of the two board surfaces being a second board surface with a second conductor pattern printed on the second board surface, and the first conductor pattern and the second conductor pattern each reach the edge of the substrate; and
    M rod-shaped conductor components, in the inspection instrument each and every one of the M rod-shaped conductor components being set with a longitudinal direction thereof being orthogonal to a normal to the first board surface of the printed wiring board and being normal to the edge of the printed wiring board, and M being a predetermined integer not more than N, wherein
    the M rod-shaped conductor components are classified into a first group including $m_1$ rod-shaped conductor components and a second group including $m_2$ rod-shaped conductor components, $m_1$ being an integer more than zero, $m_2$ being an integer more than zero, and $m_1+m_2=M$,
    any one of the $m_1$ rod-shaped conductor components belonging to the first group has one end for contact with a corresponding one of the N conductor parts of the electrical component to be inspected and an other end electrically connected to the first conductor pattern at the edge of the printed wiring board,
    any one of the $m_2$ rod-shaped conductor components belonging to the second group has one end for contact with a corresponding one of the N conductor parts of the electrical component to be inspected and an other end electrically connected to the second conductor pattern at the edge of the printed wiring board,
    one or each of the one end and the other end of each and every one of the M rod-shaped conductor components is a linearly movable plunger,
    the printed wiring board has R recesses in the edge of the printed wiring board, R being a predetermined integer equal to or greater than $m_1$ or $m_2$, whichever is not smaller, and
    the R recess include a recess where the other end of one of the $m_1$ rod-shaped conductor components is electrically connected to the first conductor pattern and the other end of one of the $m_2$ rod-shaped conductor components is electrically connected to the second conductor pattern.

2. The inspection instrument according to claim 1, further comprising at least two coaxial cables, wherein
    one of the at least two coaxial cables has at one end thereof an L-shaped connector fixed to the first conductor pattern on the first board surface of the printed wiring board, and
    another of the at least two coaxial cables has at one end thereof an L-shaped connector fixed to the second conductor pattern on the second board surface of the printed wiring board.

* * * * *